United States Patent
Ikeda et al.

(10) Patent No.: US 6,849,853 B2
(45) Date of Patent: *Feb. 1, 2005

(54) X-RAY FLAT PANEL DETECTOR

(75) Inventors: Mitsushi Ikeda, Yokohama (JP); Kouhei Suzuki, Yokohama (JP); Akira Kinno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 79 days.

This patent is subject to a terminal disclaimer.

(21) Appl. No.: 10/262,972

(22) Filed: Oct. 3, 2002

(65) Prior Publication Data

US 2003/0063706 A1 Apr. 3, 2003

(30) Foreign Application Priority Data

Oct. 3, 2001 (JP) ........................................ 2001-307609

(51) Int. Cl.[7] ............................................... G01J 1/24
(52) U.S. Cl. ............................... 250/370.09; 250/370.1; 250/370.13; 250/208.1
(58) Field of Search ..................... 378/98.8; 250/361 R, 250/370.08, 370.09, 370.11, 370.1, 370.12, 370.13, 208.1

(56) References Cited

U.S. PATENT DOCUMENTS

| | | | |
|---|---|---|---|
| 5,396,072 A | 3/1995 | Schiebel et al. | |
| 6,124,606 A | 9/2000 | den Boer et al. | 257/291 |
| 6,163,030 A * | 12/2000 | Johnson et al. | 250/370.14 |
| 6,185,274 B1 * | 2/2001 | Kinno et al. | 378/98.8 |
| 6,353,229 B1 | 3/2002 | Polischuk et al. | 250/370.14 |
| 6,403,965 B1 * | 6/2002 | Ikeda et al. | 250/370.09 |
| 6,507,026 B2 * | 1/2003 | Ikeda et al. | 250/370.09 |
| 6,559,449 B2 * | 5/2003 | Ikeda et al. | 250/361 R |
| 6,713,748 B1 * | 3/2004 | Tsutsumi et al. | 250/208.1 |
| 2002/0056810 A1 | 5/2002 | Kobayashi et al. | |

FOREIGN PATENT DOCUMENTS

| | | |
|---|---|---|
| JP | 11-307756 | 5/1999 |
| JP | 2000-58804 | 2/2000 |
| JP | 2000-75039 | 3/2000 |
| JP | 2000-241557 | 8/2000 |

* cited by examiner

*Primary Examiner*—Edward J. Glick
*Assistant Examiner*—Courtney Thomas
(74) *Attorney, Agent, or Firm*—Oblon, Spivak, McClelland, Maier & Neustadt, P.C.

(57) ABSTRACT

An X-ray flat panel detector includes an X-ray photosensitive film which generates signal charges upon being exposed to incident X-rays, pixel electrodes which are arrayed in contact with the X-ray photosensitive film, a bias voltage application unit which applies a bias voltage to the X-ray photosensitive film so as to make the pixel electrodes collect holes or electrons, which serve as the signal charges generated by the X-ray photosensitive film and have a higher mobility, capacitors which are arranged in correspondence with the pixel electrodes and store the charges generated by the X-ray photosensitive film, switching thin-film transistors which are arranged in correspondence with the pixel electrodes and read the charges in the capacitors, scanning lines which supply a control signal to OPEN/CLOSE-control the switching thin-film transistors, and signal lines which are connected to the switching thin-film transistors to read the charges when the switching thin-film transistors are opened.

29 Claims, 7 Drawing Sheets

X-RAY FLAT PANEL DETECTOR

CROSS-REFERENCE TO RELATED APPLICATIONS

This application is based upon and claims the benefit of priority from the prior Japanese Patent Application No. 2001-307609, filed Oct. 3, 2001, the entire contents of which are incorporated herein by reference.

BACKGROUND OF THE INVENTION

1. Field of the Invention

The present invention relates to an X-ray flat panel detector used in a medical X-ray diagnosis apparatus or the like and, more particularly, to an X-ray flat panel detector which uses a thin-film transistor as a switching element in each of two-dimensionally arrayed X-ray detection pixels.

2. Description of the Related Art

In recent years, X-ray flat panel detectors for electrically detecting an X-ray image have been developed as X-ray diagnosis apparatuses. In such an X-ray flat panel detector, X-ray photosensitive pixels which generate signal charges when being irradiated with X-rays are two-dimensionally arrayed. Signal charges generated by these photosensitive pixels are stored in signal charge storing sections and read out by thin-film transistors serving as switching elements.

FIG. 1 shows the circuit arrangement of one pixel of this X-ray flat panel detector. As shown in FIG. 1, the X-ray flat panel detector has a plurality of pixels 101 that are arranged in an array. Each pixel 101 is constituted by a thin-film transistor (to be referred to as a TFT hereinafter) 102 made of amorphous silicon (to be referred to as a-Si hereinafter) and used as a switching element, an X-ray charge conversion film 103 made of Se, a pixel capacitor (to be referred to as a Cst hereinafter) 104, and a protective TFT 111. The Cst 104 is connected to a Cst bias line 105.

The switching TFT 102 has a gate connected to a scanning line 107 and a source connected to a signal line 108. The TFT 102 is ON/OFF-controlled by a scanning line driving circuit 109. A terminal of the signal line 108 is connected to a signal detection amplifier 110. The source and gate of the protective TFT 111 are connected to the drain of the switching TFT 102. The drain of the protective TFT 111 is connected to a power supply 113 through a bias line 112. Note that the protective TFT 111 is sometimes omitted.

When X-rays become incident, they are converted into charges by the X-ray charge conversion film 103. The charges are stored in the Cst 104. When the scanning line 107 is driven by the scanning line driving circuit 109 to turn on the switching TFTs 102 of one row connected to one scanning line 107, the stored signal charges are transferred to the amplifier 110 side through the signal line 108. With change-over switches (not shown), the charges are input to the amplifier 110 for each pixel and converted into a dot sequential signal that is displayable on a CRT or the like. The charge amount and the output amplitude of the amplifier 110 change depending on the amount of x-ray light incident on the pixels 101. To prevent extra charges from being stored in the Cst 104, charges more than the bias voltage are removed from the bias line 112 by the protective TFT 111.

However, the presence of a protective circuit such as the protective TFT 111 poses the following problems. First, since the pixel circuit is complicated, the yield of non-defective TFT array boards decreases. Second, when the number of pixels is increased and the pixel size is reduced to obtain a higher resolution, it becomes difficult to form interconnections from the protective TFTs 111, switching TFTs 102, and the like at a sufficiently small pitch. Third, since the occupation area of the protective TFT 111 in each size-reduced pixel is large, no sufficient area can be ensured for the Cst 104.

In addition, when the number of pixels is increased and the pixel size is reduced to obtain a higher resolution, the following problems have occurred. To externally connect a TAB having a driving circuit for driving switching TFTs and an LSI for reading a signal outside the detection pixel area, these interconnections must be connected to the TFT array board on which the switching TFT 102, x-ray charge conversion film 103, Cst 104, and protective TFT 111 are arranged. At this time, if the pixel size is reduced, it becomes difficult to connect the interconnections at a sufficiently small pitch. In addition, since the ratio of the TFT area in the small pixel is too high, the signal storage capacitor cannot have a sufficient area. Furthermore, when the number of pixels increases, the signal read time per line shortens. However, in the TFT formed from a-Si, a signal cannot be sufficiently read in the short address time. For this reason, in the conventional X-ray flat panel detector and, more particularly, an X-ray flat panel detector using a-Si TFTs, when the pixel size is reduced and the number of pixels is increased to obtain a higher resolution, no satisfactory detection image can be obtained because of shortage in TFT driving capability.

For an X-ray detector for medical use, it is important to do diagnosis using an X-ray dose as low as possible to suppress the influence on the body. To do this, it is important to reduce the OFF current of a switching TFT to make it possible to detect a small amount of charges generated at a low X-ray dose. On the other hand, a satisfactory image is necessary for accurate diagnosis. In this case, it is necessary to sense an image with a high S/N ratio at a high X-ray dose. Hence, it is preferable to sense an image at an X-ray dose ranging from low level to high level. For this purpose, a switching TFT must normally operate even at a high pixel voltage corresponding to a large amount of charges. In addition, the OFF current of the switching TFT must be reduced. Many switching TFTs used in such an X-ray flat panel detector form defects by X-ray irradiation, and their characteristic degrades. The switching TFT must have a TFT characteristic that allows the TFT to operate even after degradation.

BRIEF SUMMARY OF THE INVENTION

The present invention has been made in consideration of the above situation, and has as its object to provide an X-ray flat panel detector which can prevent it from becoming complex for the protective function against a high voltage and capable of acquiring a satisfactory image even when the pixel size is reduced and the pixel number and bus line number are increased.

The present invention may provide an X-ray flat panel detector comprises: an X-ray photosensitive film which generates signal charges upon being exposed to incident X-rays; a plurality of pixel electrodes which are two-dimensionally arrayed in contact with the X-ray photosensitive film; a bias voltage application unit which applies a bias voltage to the X-ray photosensitive film so as to make the plurality of pixel electrodes collect holes or electrons, which serve as the signal charges generated by the X-ray photosensitive film and have a higher mobility; a plurality of capacitors which are arranged in correspondence with the pixel electrodes and store the charges generated by the X-ray photosensitive film; a plurality of switching thin-film transistors which are arranged in correspondence with the pixel electrodes and read the charges stored in the capacitors; a plurality of scanning lines which supply a control signal to OPEN/CLOSE-control the plurality of switching thin-film transistors; and a plurality of signal lines which are connected to the plurality of switching thin-film transistors to read the charges when the switching thin-film transistors are opened.

The present invention may provide an X-ray flat panel detector comprises: an X-ray photosensitive film which generates signal charges upon being exposed to incident X-rays; a plurality of pixel electrodes which are two-dimensionally arrayed in contact with the X-ray photosensitive film; a bias voltage application unit which applies a bias voltage to the X-ray photosensitive film so as to make the plurality of pixel electrodes collect holes or electrons, which serve as the signal charges generated by the X-ray photosensitive film and have a higher mobility; a plurality of capacitors which are arranged in correspondence with the pixel electrodes and store the charges generated by the X-ray photosensitive film; a plurality of switching thin-film transistors which are arranged in correspondence with the pixel electrodes and read the charges stored in the capacitors by using, as carriers, the holes or electrons, which serve as the signal charges generated by the X-ray photosensitive film and have a higher mobility; a plurality of scanning lines which supply a control signal to OPEN/CLOSE-control the plurality of switching thin-film transistors; and a plurality of signal lines which are connected to the plurality of switching thin-film transistors to read the charges when the switching thin-film transistors are opened.

The present invention may provide an X-ray flat panel detector comprises: an X-ray photosensitive film which is substantially made of a material having a hole mobility higher than an electron mobility and generates signal charges upon being exposed to incident X-rays; a plurality of pixel electrodes which are two-dimensionally arrayed in contact with the X-ray photosensitive film; a bias voltage application unit which applies a bias voltage to the X-ray photosensitive film so as to make the plurality of pixel electrodes collect holes; a plurality of capacitors which are arranged in correspondence with the pixel electrodes and store the charges generated by the X-ray photosensitive film; a plurality of p-channel thin-film transistors which are arranged on an insulating substrate in correspondence with the pixel electrodes, have a polysilicon film formed into an island shape on the insulating substrate, and read the signal charges stored in the capacitors; a plurality of scanning lines which supply a control signal to OPEN/CLOSE-control the plurality of p-channel thin-film transistors; and a plurality of signal lines which are connected to the plurality of p-channel thin-film transistors to read the signal charges when the p-channel thin-film transistors are opened.

The present invention may provide an X-ray flat panel detector comprises: an X-ray photosensitive film which is substantially made of a material having a higher electron mobility than a hole mobility and generates electrons and holes upon being exposed to incident X-rays; a plurality of pixel electrodes which are two-dimensionally arrayed in contact with the X-ray photosensitive film; a plurality of capacitors which are arranged in correspondence with the pixel electrodes and store the electrons generated by the X-ray photosensitive film; a plurality of n-channel thin-film transistors which are arranged in correspondence with the pixel electrodes and read the electrons stored in the capacitors; a plurality of scanning lines which supply a control signal to OPEN/CLOSE-control the plurality of n-channel thin-film transistors; and a plurality of signal lines which are connected to the plurality of n-channel thin-film transistors to read the electrons when the n-channel thin-film transistors are opened.

The present invention may provide an X-ray flat panel detector comprises: an X-ray photosensitive film which generates signal charges upon being exposed to incident X-rays; a plurality of pixel electrodes which are two-dimensionally arrayed in contact with the X-ray photosensitive film; a bias voltage application unit which applies a bias voltage to the X-ray photosensitive film; a plurality of capacitors which are arranged in correspondence with the pixel electrodes and store the charges generated by the X-ray photosensitive film; a plurality of switching thin-film transistors which comprises a p-channel thin-film transistor made of polysilicon and are arranged in correspondence with the pixel electrodes and read the charges stored in the capacitors; a plurality of scanning lines which supply a control signal to OPEN/CLOSE-control the plurality of switching thin-film transistors; and a plurality of signal lines which are connected to the plurality of switching thin-film transistors to read the charges when the switching thin-film transistors are opened.

The present invention may provide an X-ray flat panel detector comprises: an X-ray photosensitive film which generates signal charges upon being exposed to incident X-rays; a plurality of pixel electrodes which are two-dimensionally arrayed in contact with the X-ray photosensitive film; a bias voltage application unit which applies a bias voltage to the X-ray photosensitive film; a plurality of capacitors which are arranged in correspondence with the pixel electrodes and store the charges generated by the X-ray photosensitive film; a plurality of switching thin-film transistors which comprises a p-channel thin-film transistor made of polysilicon and with LDD structure and are arranged in correspondence with the pixel electrodes and read the charges stored in the capacitors; a plurality of scanning lines which supply a control signal to OPEN/CLOSE-control the plurality of switching thin-film transistors; and a plurality of signal lines which are connected to the plurality of switching thin-film transistors to read the charges when the switching thin-film transistors are opened.

DETAILED DESCRIPTION OF THE INVENTION

The first to third embodiments of the present invention will be described below with reference to the accompanying drawing.

(First Embodiment)

Figure 2:
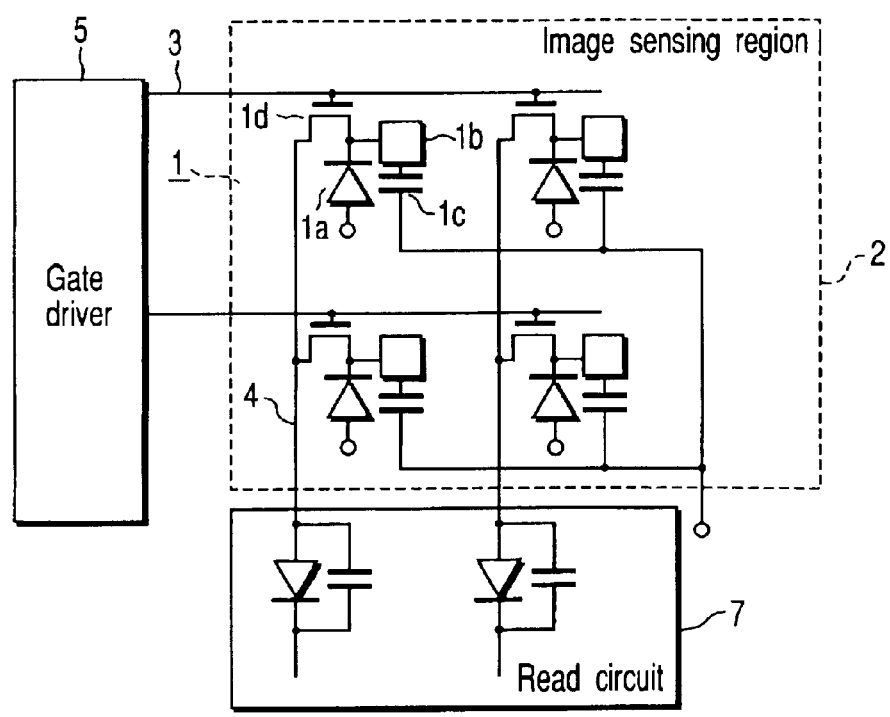
FIG. 2 is a circuit diagram showing the basic arrangement of an X-ray flat panel detector according to the first embodiment of the present invention.

FIG. 2 is a circuit diagram showing the basic arrangement of an X-ray flat panel detector according to the first embodiment of the present invention.

X-ray detection pixels 1 for converting incident X-rays into an electrical signal are two-dimensionally arrayed to form an image sensing region 2. Each pixel 1 comprises an X-ray charge conversion film 1a for converting incident X-rays into an electrical signal, a pixel electrode 1b connected to the X-ray charge conversion film 1a, a storage capacitor 1c connected to the pixel electrode 1b, and a switching thin-film transistor (TFT) 1d having a source connected to the pixel electrode 1b. FIG. 2 shows a simple 2×2 pixel arrangement. In fact, an m×n pixel arrangement including a number of rows and a number of columns is formed.

An important point of the present invention is that the direction of a bias voltage to be applied to the X-ray charge conversion film 1a is selected in accordance with the type of X-ray charge conversion film 1a. More specifically, when the X-ray charge conversion film 1a having a hole mobility higher than the electron mobility is used, a bias voltage is applied to the X-ray charge conversion film 1a in a direction in which holes are collected by the pixel electrode. On the other hand, when an X-ray photosensitive film having an electron mobility higher than the hole mobility is used, a bias voltage is applied to the X-ray charge conversion film 1a in a direction in which electrons are collected by the pixel electrode. For a more detailed description, an X-ray flat panel detector which uses the X-ray charge conversion film 1a having a hole mobility higher than the electron mobility will be exemplified in the following embodiments.

In the image sensing region 2, a plurality of scanning lines 3 and a plurality of signal lines 4 are arranged to be perpendicular to each other. The scanning lines 3 are connected to the gates of the switching TFTs 1d in the image sensing region 2 and to a gate driver 5 for selectively driving the pixels outside the image sensing region 2. The signal lines 4 are connected to the drains of the switching TFTs 1d in the image sensing region 2 and to a noise correction circuit 6. A signal on signal lines 4 is read and output by a read circuit 7 outside the image sensing region 2.

Figure 3A:
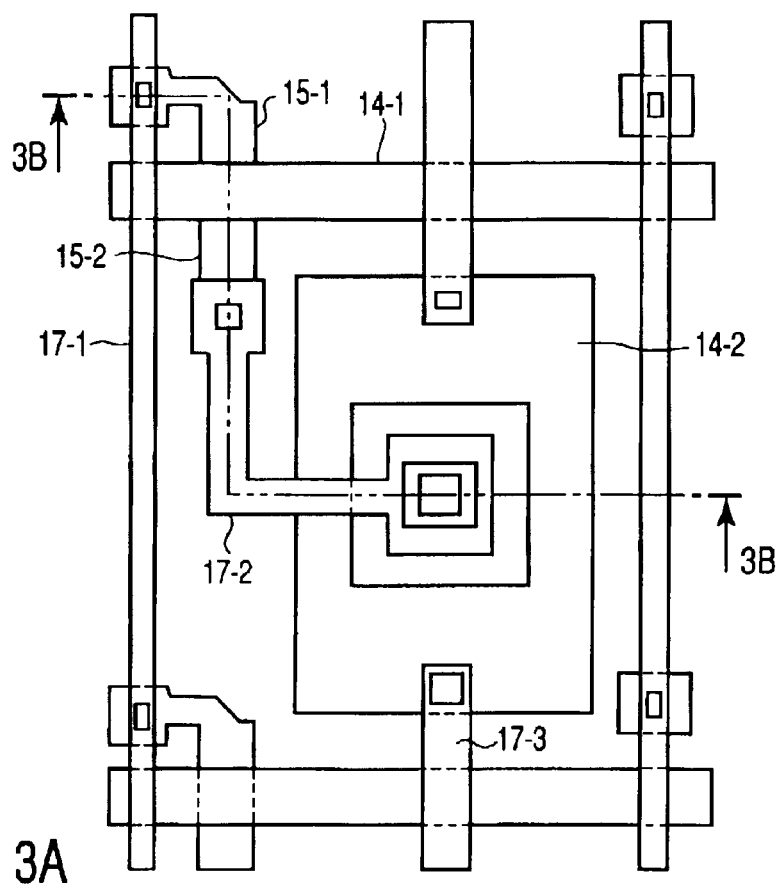
FIG. 3A is a plan view showing the structure of a pixel 1.
Figure 3B:
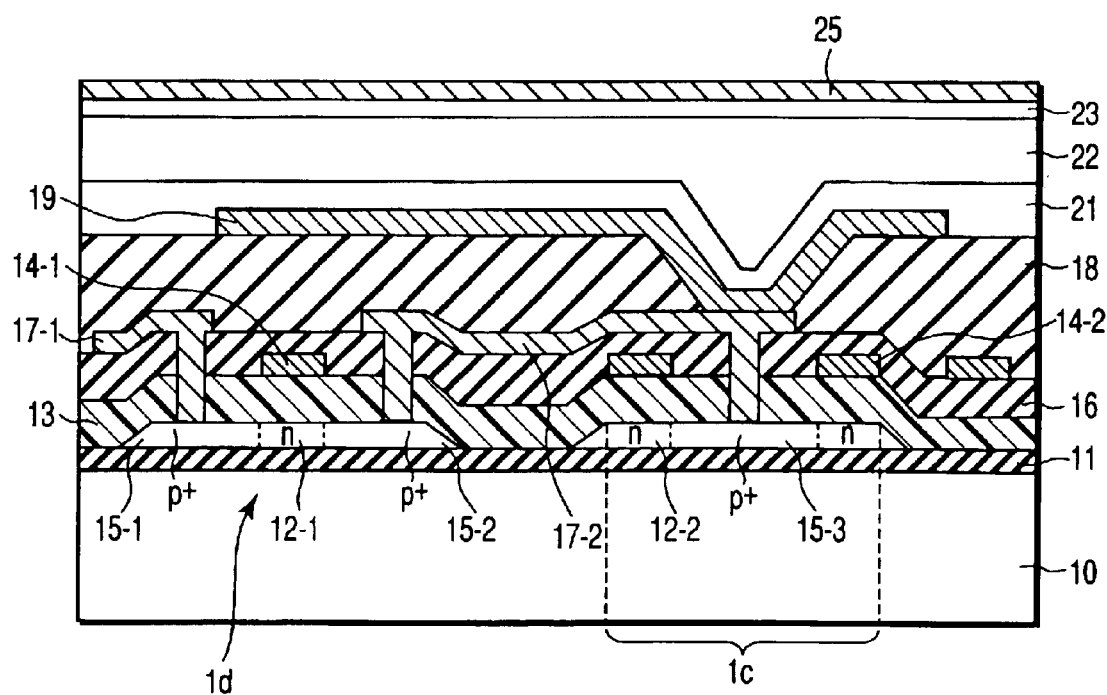
FIG. 3B is a sectional view showing the structure of the pixel 1.

FIG. 3A is a plan view showing the structure of the pixel 1. FIG. 3B is a sectional view showing the structure of the pixel 1. An SiN$_X$ (50 nm)/SiO$_2$ (100 nm) film serving as an undercoat insulating film 11 is formed on a glass substrate 10. A 50-nm thick amorphous Si (a-Si) film is formed on the undercoat insulating film 11.

The a-Si film is converted into polysilicon by ELA (Excimer Laser Anneal) to form a 50-nm thick polysilicon (p-Si) film 12. The p-Si film 12 is etched to form a transistor region island 12-1 and capacitor region island 12-2. A 150-nm thick gate SiO$_2$ film 13 is formed by PCVD or thermal CVD. A 300-nm thick gate electrode 14-1 and a 300-nm thick gate electrode 14-2 are formed on the transistor region island 12-1 and the capacitor region island 12-2, respectively, as the MoW gates.

Next, using the gate electrodes or a resist as a mask, B is doped by ion implantation at a high concentration of $1\times10^{14}$ cm$^{-2}$ to $5\times10^{16}$ cm$^{-2}$, preferably, $1\times10^{15}$ cm$^{-2}$ to $1\times10^{16}$ cm$^{-2}$, and in this embodiment, $3\times10^{15}$ cm$^{-2}$ to form p$^+$-regions 15. That is, a drain 15-1 and source 15-2 formed from the p$^+$-regions are formed in the transistor region, and a p$^+$-region 15-3 is formed in the capacitor region. A gate width W and gate length L are defined as, e.g., W/L=10/5 μm.

Next, a 500-nm thick SiO$_2$ film 16 serving as a dielectric interlayer is formed by PCVD. Holes are formed in the source/drain contact portion of the SiO$_2$ film 16 to form a signal line 17-1 connected to the drain 15-1 of the TFT 1d, a Cs line 17-2 connected to the source 15-2 of the TFT 1d and the p$^+$-region 15-3 of the storage capacitor 1c, and a capacitor line 17-3 connected to the storage capacitor by an Mo/Al/Mo film 17. Next, a 400-nm thick SiN$_X$ film (not shown) for passivation is formed by PCVD. After that, a protective film 18 is formed by coating an acrylic resin to 2 to 5 μm, and preferably, 3 μm. A contact portion is formed using an acrylic photosensitive resin by exposing and developing it. A 100-nm thick ITO film is formed and patterned into a desired shape, thereby forming an ITO pixel electrode 19.

Then, a p-Se layer 21, i-type Se layer 22, and n-Se layer 23 are formed in this order as an X-ray photosensitive film 20. More specifically, a p-Se or p-As$_2$Se$_3$ film 21 is formed to 5 to 100 μm, and preferably, 10 μm by vapor deposition. An undoped high-resistance Se film 22 having a thickness of 900 μm is formed on this film. An n-Se layer 23 is further formed to 5 to 100 μm, and preferably, 10 μm. Cr is deposited to 100 nm and Al is deposited to 300 nm on the uppermost portion, thereby forming an upper electrode 25.

Since the above structural elements are formed on a glass substrate, all manufacturing steps are executed at a temperature not higher than 500° C. so as to obtain an optimal TFT array. For this reason, the p-Si used in the X-ray charge conversion film 1a has characteristics different from those of the p-Si used in an LSI which is usually baricated at higher temperatures.

The X-ray photosensitive film 1a can be made of any photosensitive material as far as it has a high hole mobility. More specifically, a photosensitive material such as GaP, AlSb, and a-Si can be used. On the other hand, for an X-ray photosensitive film whose electron mobility is higher than the hole mobility, CdZnTe, CdSe, HgI$_2$, PbI$_2$, ZnTe, CdTe, CdS, or the like can be used.

In addition, a bias voltage is applied to the X-ray charge conversion film 1a through the upper electrode 25 such that holes or electrons, which have a higher mobility, are collected by the pixel electrode 1b. In this case, since the X-ray charge conversion film 1a is formed using a photosensitive material having a hole mobility higher than the electron mobility, a bias voltage is applied such that holes are collected by the pixel electrode 1b while using the upper electrode 25 as a positive pole.

The switching thin-film transistor (TFT) 1d has a polarity corresponding to the type of X-ray charge conversion film 1a. More specifically, when the hole mobility in the X-ray charge conversion film 1a is higher than the electron mobility, a p-channel TFT is used as the switching thin-film transistor 1d. On the other hand, when the electron mobility in the X-ray charge conversion film 1a is higher than the hole mobility, an n-channel TFT is used as the switching thin-film transistor 1d. In this embodiment, since the X-ray charge conversion film 1a having a hole mobility higher than the electron mobility is used, the switching thin-film transistor (TFT) 1d is a p-channel TFT.

The switching thin-film transistor 1d is a policrystallin-Si TFT (to be referred to as a "p-Si TFT" hereinafter). The p-Si TFT is used due to, e.g., the following reason.

To drive a highly precise X-ray flat panel detector having a number of pixels, a TFT having a high switching speed is necessary. A conventional amorphous-Si TFT (to be referred to as an "a-Si TFT" hereinafter) has a low electron mobility and therefore cannot sufficiently drive the X-ray flat panel detector. Therefore, an p-Si TFT with a high mobility is used as a TFT having a high switch speed. The mobilities of electrons and holes are higher than those of a-Si by about two orders of magnitude. The mobilities of electrons and holes of p-Si are 100–400 and 50–200, respectively.

Although it is possible to use monocrystalline silicon, a substrate formed of this material is small in size, and a wide-area TFT array required of an X-ray detector cannot be easily formed using such a small-sized substrate. In contrast, p-Si can be formed on a glass substrate and is therefore suitable for realizing a wide-area TFT array.

Figure 3C:
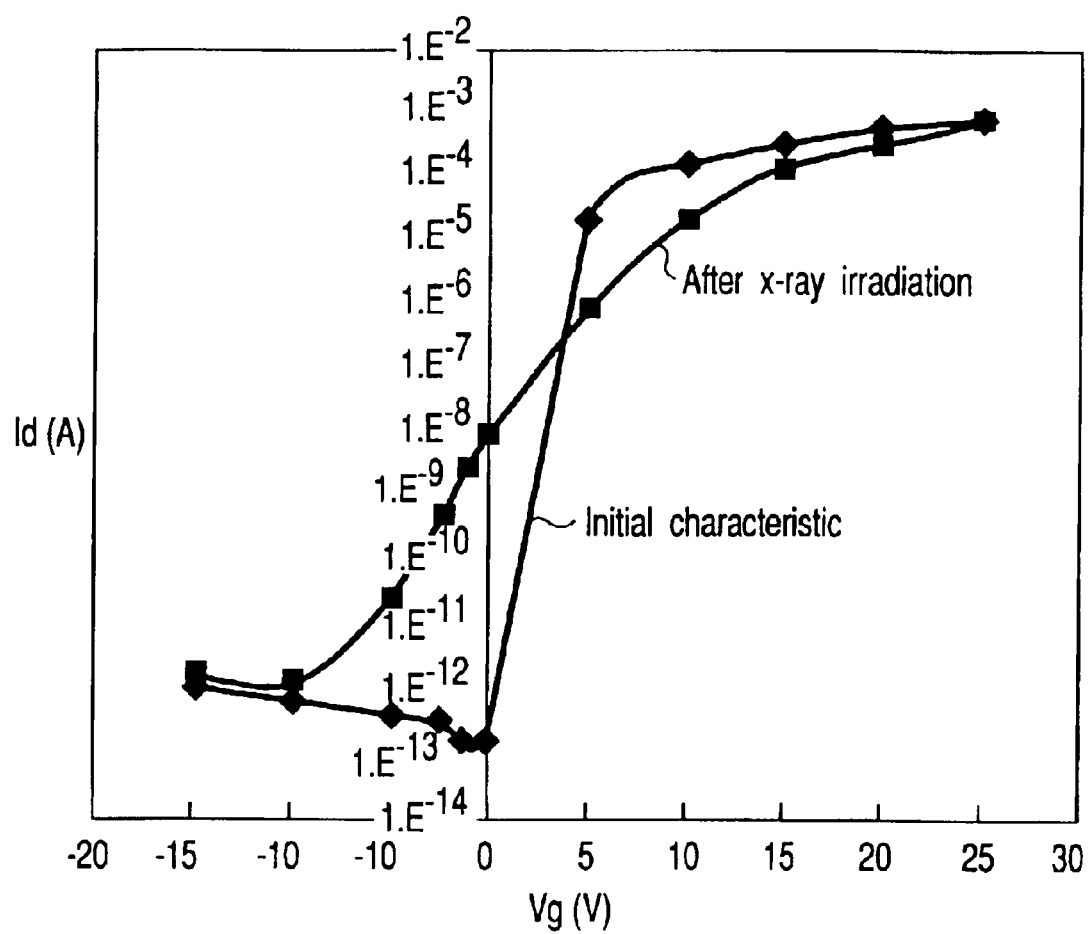
FIG. 3C is a view showing a change in leading edge of the switching characteristic of an n-channel p-Si TFT used in a conventional X-ray flat panel detector before and after X-ray irradiation.

However, the present inventors found that an n-channel p-Si TFT largely degrades the leading edge of the switching characteristic by X-ray irradiation, as shown in FIG. 3C. The degradation in leading edge of the switching characteristic is not observed in an a-Si TFT but is especially conspicuous in a p-Si TFT. Due to this degradation, the present inventors found that the n-channel p-Si TFT is not always suitable for the X-ray flat panel detector. In addition, to cause the TFT to act as a protective diode, it must be driven at a high drain voltage Vd.

The present inventors found as a result of extensive studies that a p-channel p-Si TFT has a high drain breakdown voltage Vd and a high X-ray resistance and therefore is suitable as the switching thin-film transistor 1d. The conspicuous effect of usage of a p-channel p-Si TFT will the described later in detail.

Conventionally, p-Si TFTs have been used in a liquid crystal display device (TFT-LCD). Since the LCD does not require resistance to X-rays, n-channel p-Si TFTs with improved mobility have been used. The inventors discovered for the first time that the use of p-channel TFTs was desirable where X-ray irradiation was executed. According to this arrangement, when a positive voltage is applied to the upper electrode 25, such a bias voltage can be applied to the X-ray charge conversion film 1a that holes are collected by the pixel electrode 1b. With this bias voltage, holes generated in the X-ray charge conversion film 1a in accordance with the incident amount of X-rays can be stored in the storage capacitor 1c as signal charges. When the switching TFT 1d made of a p-channel p-Si TFT is turned on through the scanning line 3, the stored signal charges can be read to the signal line 4 at a high speed and high S/N ratio. More specifically, the X-ray flat panel detector operates in the following manner.

Figure 4:
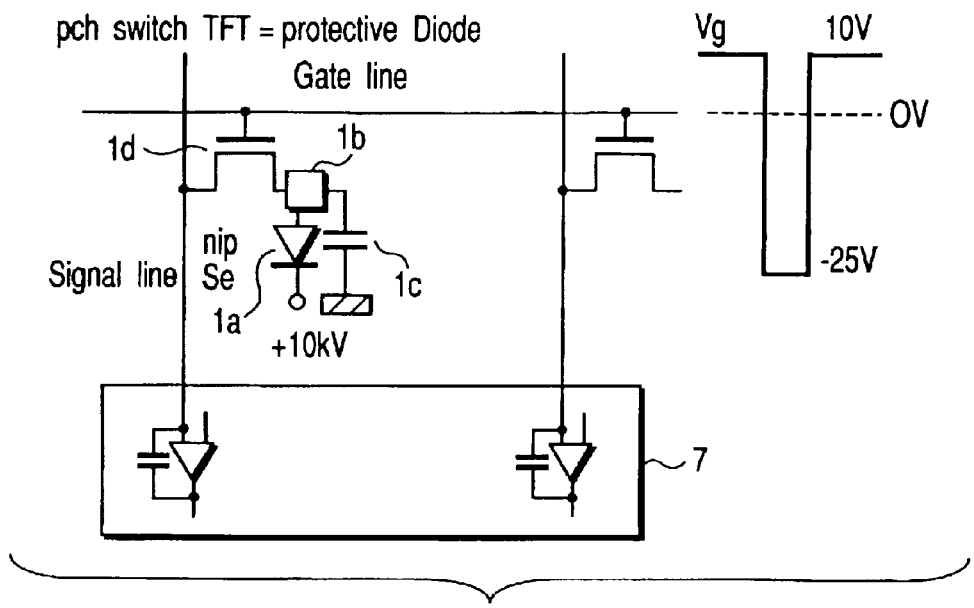
FIG. 4 is a view for explaining the operation of the X ray flat panel detector according to the first embodiment.

FIG. 4 is a view for explaining the operation of the X-ray flat panel detector according to this embodiment. Referring to FIG. 4, a positive voltage of 10 V is applied from the upper electrode 25, thereby applying a bias voltage to the X-ray photosensitive film 1a. The switching TFT 1d is driven, as shown in FIG. 4. That is, in the gate-off state, a voltage of, e.g., 10 V is applied. The switching TFT is turned on by applying a voltage of, e.g., −25 V as a gate pulse. At the time of application of the gate pulse, X-ray irradiation is stopped. In imaging, X-ray irradiation is stopped at the time of gate pulse application. For sequential fluoroscopy, a gate pulse is appropriately applied during X-ray irradiation, and signal charges are read.

With this operation, the pixel is irradiated with very strong X-rays, and the pixel potential greatly rises. When the potential becomes equal to or more than the sum of the gate pulse off voltage and the threshold value of the switching TFT, the switching TFT is turned on, and charges in the pixel (extra charges in the storage capacitor) flow to the signal line.

Since the pixel potential never becomes equal to or more than the sum of the gate pulse off voltage and the threshold value of the switching TFT, breakdown of the gate insulating film of the switching TFT does not occur. For this reason, the switching TFT can be protected from a high voltage.

Figure 5A:
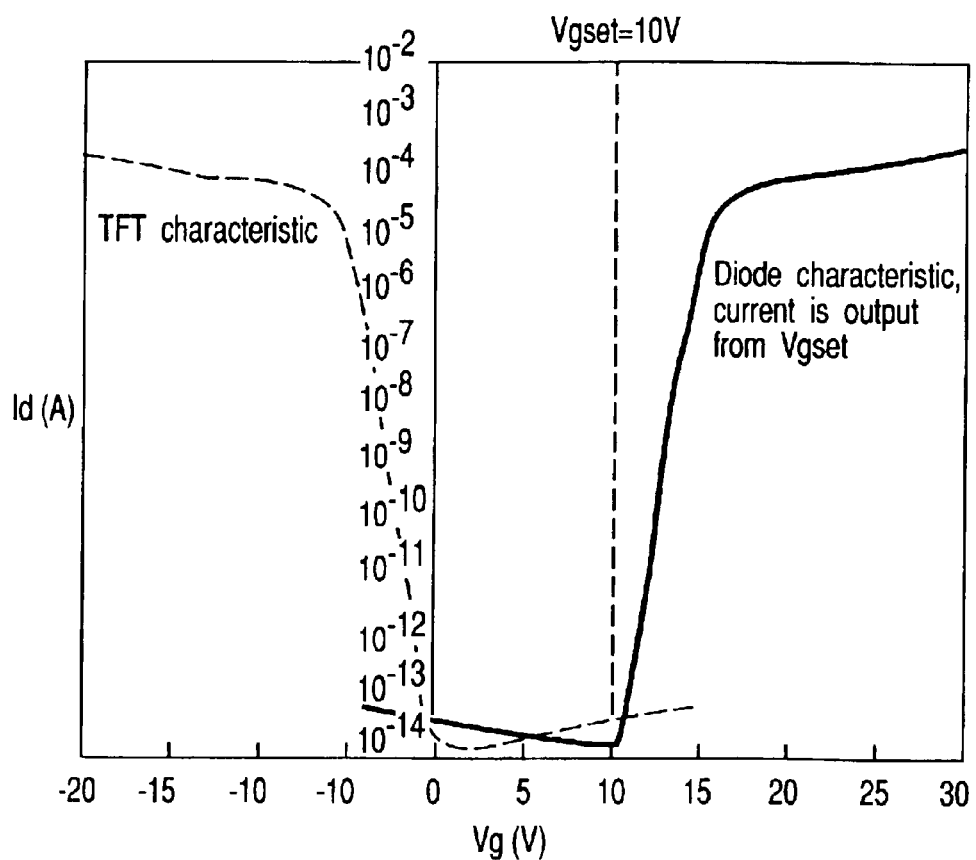
FIG. 5A is a graph showing the diode characteristic of a p-channel p-Si TFT when a voltage of 10 V is applied in a gate-off state together with the TFT characteristic of the p-channel TFT

FIG. 5A shows the diode characteristic of the p-channel TFT when a voltage of 10 V is applied in the gate-off state as well as the TFT characteristic of the p-channel TFT.

Figure 1:
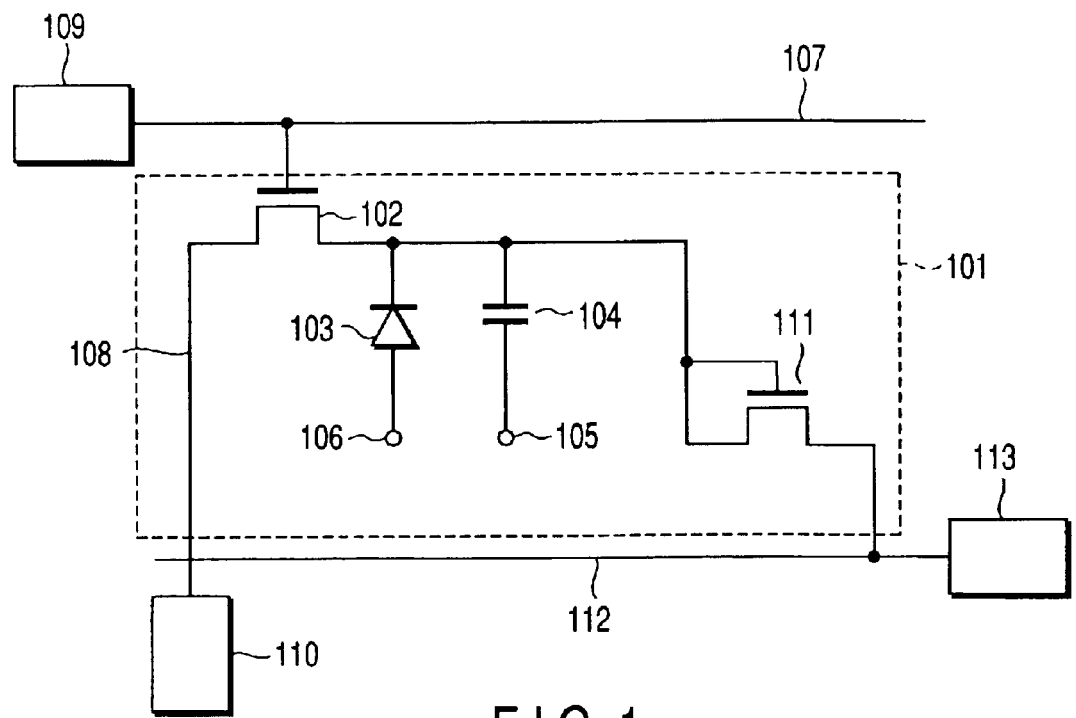
FIG. 1 is a circuit diagram showing the circuit arrangement of one pixel of an X-ray flat panel detector.

That is, according to the X-ray flat panel detector of this embodiment, since the switching TFT can have the function of a protective circuit, no protective circuit for preventing extra charges from being stored in the storage capacitor 1c need be separately prepared. Unlike the conventional X-ray flat panel detector shown in FIG. 1, in a TFT array board on which a bias line for a protective TFT is arranged, no interconnections for externally connecting a driving circuit for driving the switching TFT or a TAB having an LSI for reading a signal need be connected. As a result, even when the pixel size is reduced, the interconnections can be connected at a sufficiently small pitch. In addition, since no protective circuit is necessary, a sufficient area can be ensured for the storage capacitor even in a smaller pixel.

The X-ray flat panel detector according to this embodiment, a p-channel TFT formed from p-Si is used as the switching TFT 1d. With this arrangement, the following effects can be obtained.

As the first effect, since holes having a high mobility are detected as charges in the Se film having a hole mobility higher than the electron mobility, the S/N ratio can be increased. More specifically, in the Se film serving as an X-ray photosensitive film, if electrons having a low mobility are used as charges to be stored in the storage capacitor, spatial charges are readily generated by slow mobility electrons trapped at defect sites. For this reason, the electrons are attracted by the Coulomb force and reach neighboring pixels. This degrades the resolution. In addition, possibility of appearance of image ghost due to the stored spatial charges occurs. In this embodiment, however, since holes which have a high mobility and rarely generate spatial charges are stored in the storage capacitor, the resolution rarely degrades, and image ghost rarely occurs.

As the second effect, the breakdown voltage of the switching TFT 1d for the drain voltage can be made sufficiently high. According to experiments by the present inventors, a p-channel TFT manufactured by the technique described in this embodiment can operate at a voltage Vd of about 25 V even when the gate length L is 2 μm. To the contrary, in an n-channel TFT of a conventional X-ray flat panel detector, the drain breakdown voltage is about ½, i.e., 15 V. The degradation in TFT characteristic due to the drain voltage occurs because the high-energy carriers accelerated by the drain field enter the gate insulating film, generate a defect and degrade it.

In the X-ray flat panel detector of this embodiment, a p-channel p-Si TFT is used as the switching TFT 1d. Hence, since the hole mobility is lower than the electron mobility, and the energy in the drain is low, the degradation in TFT characteristic by the drain voltage can be reduced. In addition, the defective charges that degrade the TFT characteristic have positive charges. Hence, holes serving as carriers in the switching TFT 1d run just separately from the surface of the gate instating film having the defect and therefore can reduce the influence from the defective charges.

As the third effect, the X-ray flat panel detector according to this embodiment uses a p-channel TFT as the switching TFT 1d and therefore has a high X-ray resistance. More specifically, a switching TFT used in an X-ray flat panel detector generally forms a defect by X-ray irradiation and its characteristic degrades. The conventional X-ray flat panel detector cannot normally operate in some cases due to the degradation in characteristic. However, as will be described below, the inventors of the present invention discovered that in the case of an n-channel p-Si TFT, the degradation was so marked that the flat panel detector did not function normally. The inventors also discovered that in the case of a p-channel p-Si TFT, the X-ray irradiation did not much degrade the Vth and S-factor of the TFT than n-ch p-Si TFTs, and the flat panel detector functioned satisfactorily. As can be understood, for example, from the data shown in Table 1 of L. K. Wang "X-ray Lithography Induced Radiation Damage in CMOS and Bipolar Devices", Journal of Electronic Materials, Vol. 21, No. 7, 1992, the phenomenon described above has a similar effect to that of the phenomenon wherein the adverse effects of the X-ray irradiation, namely, variations in "Vth" and variations in the inclination S-factor in the switching region, are less marked in a p-channel SiMOS transistor than in an n-channel SiMOS transistor. At any rate, the phenomenon described above is more marked in the case of polycrystalline Si.

Figure 5B:
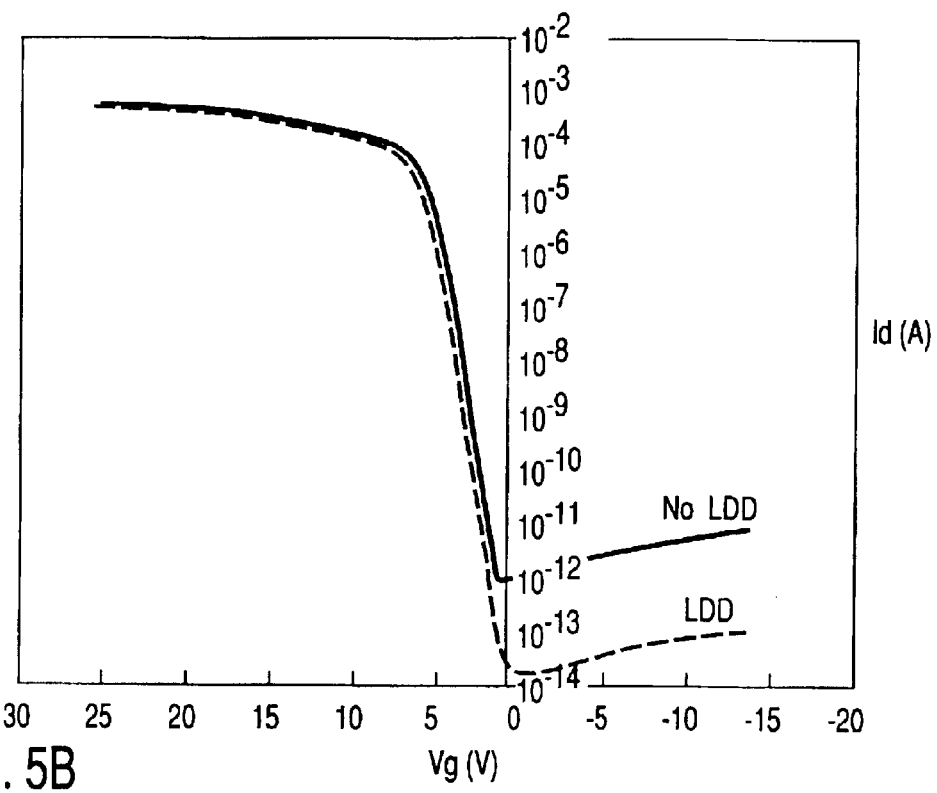
FIG. 5B is a graph showing the off-leakage current of a p-channel TFT 1d that is formed by the process of the first embodiment using p-Si.

As the fourth effect, the off-leak current can be reduced, and even a small amount of charges produced with a small dose of X-rays can be detected with a high S/N ratio. FIG. 5B illustrates an off-leak current that flows in a p-channel TFT 1d formed of P-Si and manufactured in such a method as provided in the present invention. As shown in FIG. 5B, the off-leak current can be reduced when the switching TFT 1d has an LDD structure. This phenomenon will be detailed later in relation to the second embodiment.

Figure 5C:
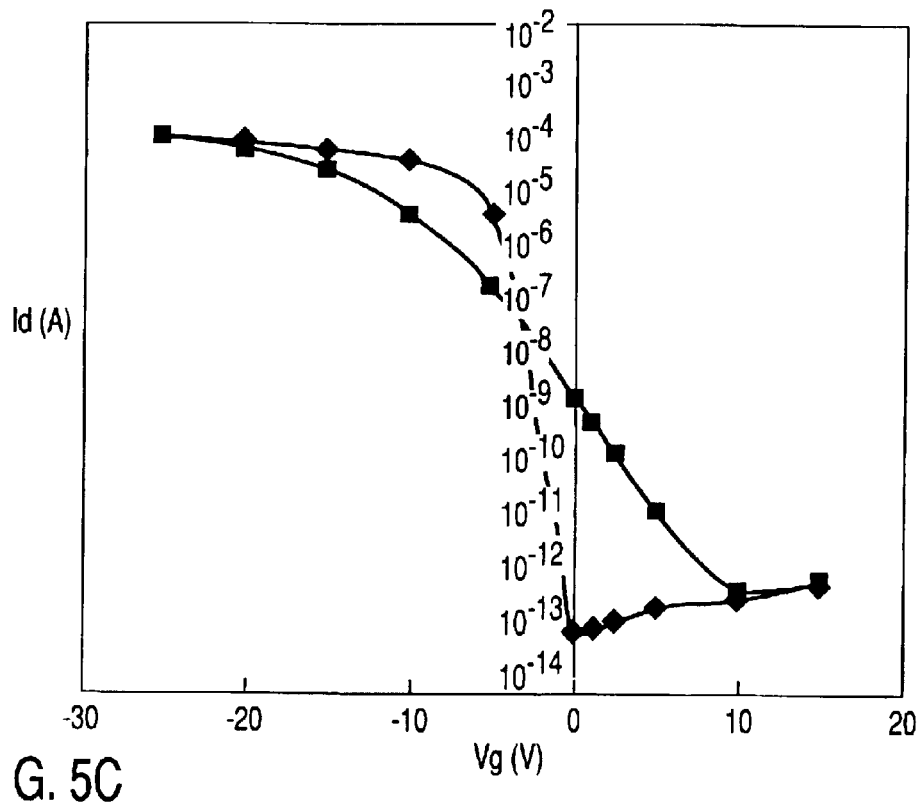
FIG. 5C is a graph showing the characteristic of the p-channel TFT of the first embodiment before and after X-ray irradiation.

FIG. 5C is a graph showing the characteristic of the p-channel TFT of this embodiment before and after X-ray irradiation. Referring to FIG. 5C, ◇ indicates the characteristic before irradiation, and □ indicates the characteristic after irradiation. As compared to before X-ray irradiation, after X-ray irradiation, a threshold value Vth of the TFT changes, and the gradient of the sub-threshold value becomes moderate. The degradation due to X-ray irradiation is smaller in a p-channel p-Si TFT than in an n-channel p-Si TFT. Hence, to keep the current driving capability, a higher voltage Vd is necessary. As the voltage Vd increases, the TFT characteristic degrades. However, since Vd breakdown voltage and X-ray resistance are higher in the p-channel TFT than in an n-channel TFT, the TFT can be driven even at a higher voltage Vd. Accordingly, since the amount of signal charges that can be stored in the storage capacitor can be increased, a signal can be detected at a high S/N ratio without any saturation even for strong X-rays.

(Second Embodiment)

Figure 6A:
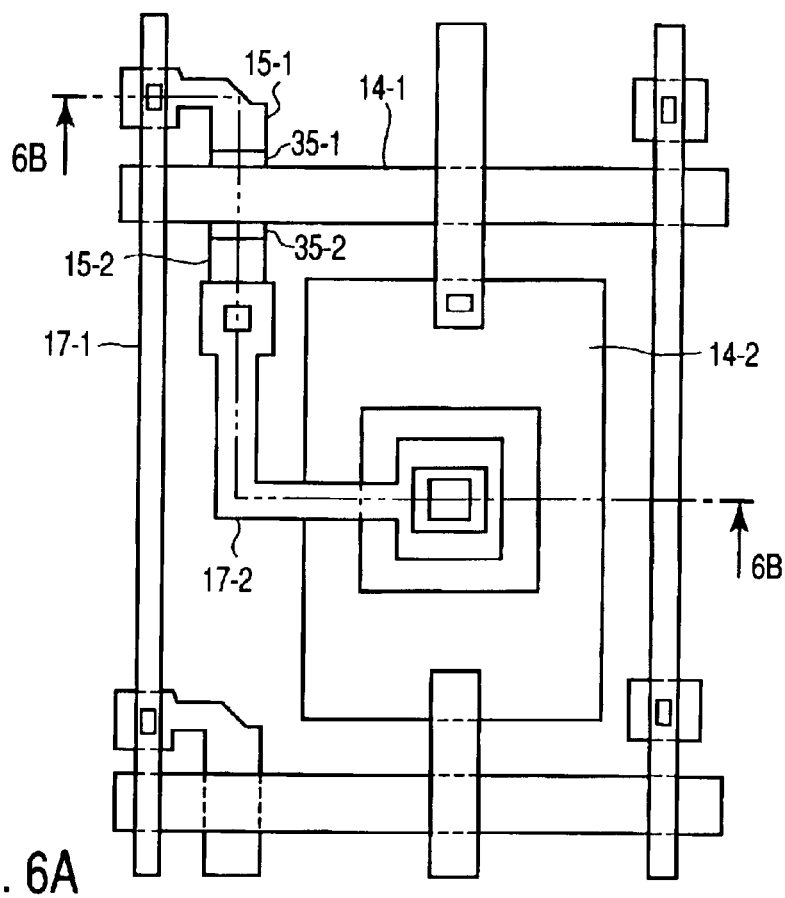
FIG. 6A is a plan view showing the structure of one pixel of an X-ray flat panel detector according to the second embodiment of the present invention.
Figure 6B:
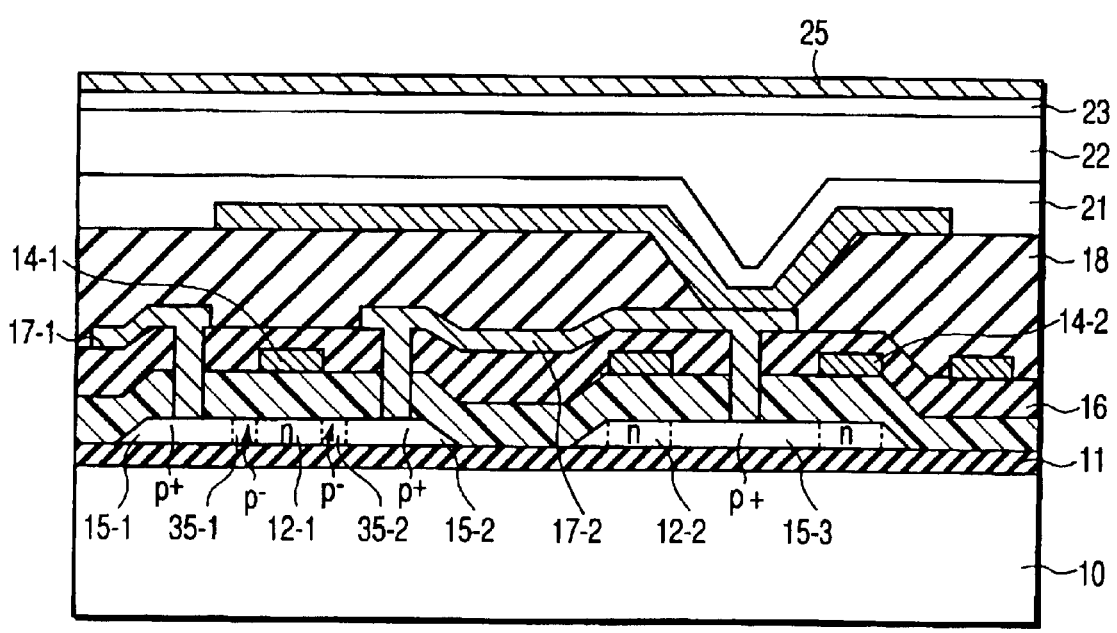
FIG. 6B is a sectional view showing the structure of one pixel of the X-ray flat panel detector.

FIG. 6A is a plan view showing the structure of one pixel of an X-ray flat panel detector according to the second embodiment of the present invention. FIG. 6B is a sectional view showing the structure of one pixel of the X-ray flat panel detector. The same reference numerals as in FIG. 3A denote the same parts in FIGS. 6A and 6B, and a detailed description thereof will be omitted.

The second embodiment is different from the above-described embodiment in that the switching TFT has an LDD (Lightly Doped Drain) structure. The process until an undercoat insulating film 11, p-Si film 12, gate $SiO_2$ film 13, and gate electrodes 14 are formed on a glass substrate 10 is the same as in the first embodiment.

Next, using the gate electrodes or a resist as a mask, B is doped by ion implantation at $1 \times 10^{11}$ cm$^{-2}$ to $5 \times 10^{14}$ cm$^{-2}$, preferably, $3 \times 10^{12}$ cm$^{-2}$ to $5 \times 10^{13}$ cm$^{-2}$, and in this embodiment, $2 \times 10^{13}$ cm$^{-2}$ to form p$^-$-regions 35-1 and 35-2 of LDDs. This almost corresponds to an impurity concentration of $1 \times 10^{17}$ cm$^{-3}$ to $1 \times 10^{20}$ cm$^{-3}$. The LDD length is preferably 0.5 to 5 μm, and preferably, 1 to 4 μm. In this embodiment, the LDD length is 2 μm. In addition, W/L= 10/5 μm.

Next, using a resist as a mask, B is doped by ion implantation at a high concentration of $1 \times 10^{14}$ cm$^{-2}$ to $5 \times 10^{16}$ cm$^{-2}$, preferably, $1 \times 10^{15}$ cm$^{-2}$ to $1 \times 10^{16}$ cm$^{-2}$, and in this embodiment, $3 \times 10^{15}$ cm$^{-2}$ to form p$^+$-regions 15-1 and 15-2 of as source and drain electrodes.

Subsequently, as in the first embodiment, holes are formed in the source/drain contact portion to form a signal line 17-1 and a Cs line 17-2 by an Mo/Al/Mo film. In addition, an $SiN_X$ film for passivation and a protective film 18 made of an acrylic resin are formed. After that, a contact portion is formed, and a pixel electrode 19 made of an ITO film is formed. Then, an X-ray photosensitive film 20 is formed, and an electrode 25 is formed on the uppermost portion.

FIG. 5B shows comparison between the off-leakage current of the p-channel TFT formed from p-Si in the above way and that of a TFT without any LDD. When the LDD is formed, the off current can be decreased as compared to the TFT without any LDD. The off current of a TFT for driving a pixel in an X-ray detector must be $1 \times 10^{-12}$ A or less. When the LDD is formed, the off current can sufficiently be made as small as $3 \times 10^{-14}$ A or less.

Signals in liquid crystal TFTs are higher in level than those in X-ray detectors, and the off-current of the TFTs is on the order of $1 \times 10^{-10}$A. For this reason, the liquid crystal TFTs are not p-channel p-Si TFTs of LDD structure and are therefore suitable for use in X-ray flat panel detectors.

When Se is used as an X-ray photosensitive film, Se acts as a photodiode that has an especially high resistance and very small leakage current. For this reason, when the leakage current when the switch TFT is OFF is reduced, a small signal by weak X-rays can also be processed. Hence, a highly sensitive X-ray detector can be implemented. The present inventors found by studies that, in p-Si TFTs, a p-channel p-Si TFT having an LDD can make the current in the OFF state smallest. Hence, when Se which has very small dark current characteristics is used as the X-ray photosensitive film, and a p-channel p-Si TFT is used as a switching element, an X-ray flat panel detector whose sensitivity is much higher than the prior art can be implemented.

Since the p-channel TFT has a high drain breakdown voltage as compared to an n-channel TFT, a larger X-ray signal can be processed. Accordingly, the dynamic range increases.

As for the TFT characteristics before and after X-ray irradiation, after X-ray irradiation, a threshold value Vth changes, and the gradient of the sub-threshold value becomes moderate, as in FIG. 5C described in the first embodiment. However, since the X-ray flat panel detector can be driven at a higher voltage Vd, and the amount of signal charges that can be stored in the storage capacitor can be increased because of use of the p-channel TFT, as in the first embodiment, a signal can be detected without any saturation even for strong X-rays. Hence, the dynamic range can be increased.

In addition, since the sub-threshold is little affected by the X-ray irradiation, the amount of signal charges that can be subjected to signal processing can be increased.

(Third Embodiment)

Figure 7:
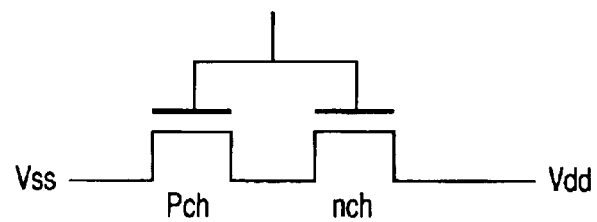
FIG. 7 is a circuit diagram showing a driver circuit in an X-ray flat panel detector according to the third embodiment of the present invention.
Figure 8:
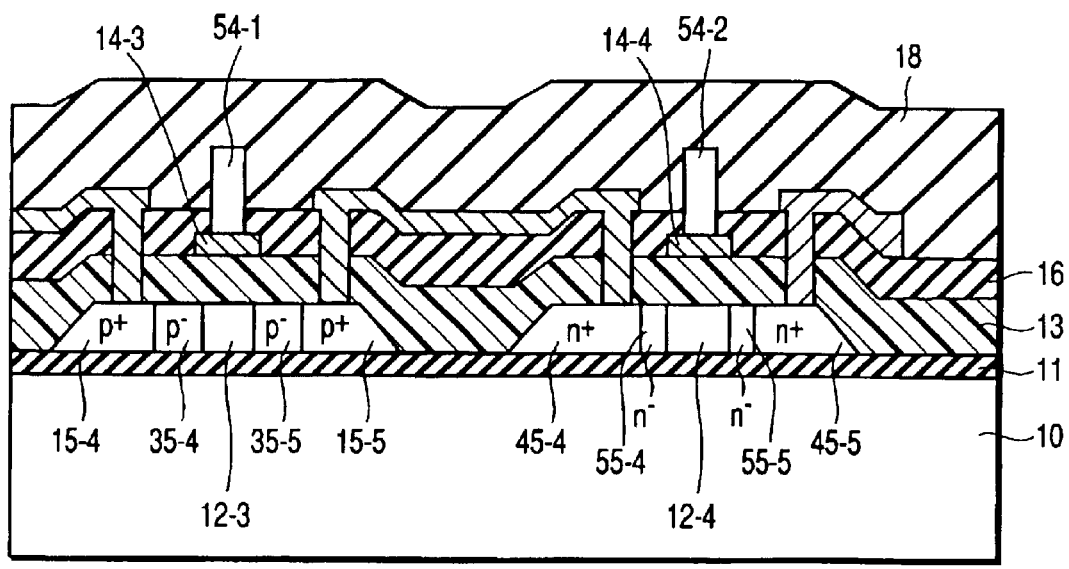
FIG. 8 is a sectional view of the driver circuit shown in FIG. 7.

FIG. 7 is a circuit diagram showing a driver circuit in an X-ray flat panel detector according to the third embodiment of the present invention. FIG. 8 is a sectional view of the driver circuit. The same reference numerals as in FIG. 3B denote the same parts in FIG. 8, and a detailed description thereof will be omitted.

In this embodiment, a driver circuit arranged in a peripheral circuit for driving a switching TFT is constituted using a p-channel TFT and n-channel TFT. Each TFT is manufactured simultaneously with TFTs in the image sensing region.

As in the image sensing region, an $SiN_X$ (50 nm)/$SiO_2$ (100 nm) film serving as an undercoat insulating film 11 is formed on a glass substrate 10. A 50-nm thick a-Si film is formed on the undercoat insulating film 11. The a-Si film is converted into polysilicon by ELA to form a 50-nm thick p-Si film 12. The p-Si film 12 is etched to form peripheral circuit islands 12-3 and 12-4 together with a transistor region island 12-1 and capacitor region island 12-2. A 150-nm thick gate $SiO_2$ film 13 is formed by PCVD or thermal CVD.

Next, 300-nm thick MoW gates 14 are formed. In this case, gate electrodes 14-3 and 14-4 of CMOS transistors in peripheral circuits are formed together with a gate electrode 14-1 in the transistor region and a gate electrode 14-2 in the capacitor region in the image sensing region.

Next, as in the image sensing region, using the gate electrodes or a resist as a mask, B is doped at $2 \times 10^{13}$ cm$^{-2}$ to form p$^-$-regions 35-4 and 35-5 of an LDD. This almost corresponds to an impurity concentration of $1 \times 10^{17}$ cm$^{-3}$ to $1 \times 10^{20}$ cm$^{-3}$. The LDD length is, e.g., 2 μm. In addition, W/L=10/5 μm. Next, using a resist as a mask, B is doped at a high concentration of $3 \times 10^{15}$ cm$^{-2}$ to form p$^+$-regions 15-4 and 15-5 of source and drain electrodes.

Next, independently of the image sensing region, using the gate electrodes or a resist as a mask, P is doped by ion implantation at $1 \times 10^{11}$ cm$^{-2}$ to $5 \times 10^{14}$ cm$^{-2}$, preferably, $3 \times 10^{12}$ cm$^{-2}$ to $5 \times 10^{14}$ cm$^{-2}$, and in this embodiment, $2 \times 10^{13}$ cm$^{-2}$ to form n$^-$-regions 55-4 and 55-5 of LDDs. This almost corresponds to an impurity concentration of $3 \times 10^{16}$ cm$^{-3}$ to $2 \times 10^{21}$ cm$^{-3}$. The LDD length is preferably 0.5 to 5 μm, and preferably, 1 to 4 μm. In this embodiment, the LDD length is, e.g., 2 μm. In addition, W/L=10/5 μm. Next, using a resist as a mask, P is doped at a high concentration of $1 \times 10^{14}$ cm$^{-2}$ to $5 \times 10^{16}$ cm$^{-2}$, preferably, $3 \times 10^{14}$ cm$^{-2}$ to $5 \times 10^{15}$ cm$^{-2}$, and in this embodiment, $2 \times 10^{15}$ cm$^{-2}$ to form n$^-$-regions 45-4 and 45-5 of source and drain electrodes.

Next, as in the image sensing region, a 500-nm thick $SiO_2$ film 16 serving as a dielectric interlayer is formed by PCVD. Holes are formed in the source/drain contact portion to form a signal line 17-1 and Cs line 17-2 by an Mo/Al/Mo film.

Simultaneously, interconnections 54-1 and 54-2 connected to the gate electrodes 14-4 and 14-5 are formed. After that, an $SiN_X$ film for passivation is formed by PCVD. In addition, a protective film 18 is formed by coating an acrylic resin to 2 to 5 μm, and preferably, 3 μm. Since the protective film 18 is made of a photosensitive resin, contact holes can be formed only by exposure and development.

With the above process, the pixel circuit is formed using a p-channel TFT while the peripheral driving circuit is formed using a CMOS made of a p-channel TFT and n-channel TFT.

When the driving circuit having the CMOS structure of TFTs made of p-Si manufactured in this embodiment is used, signal charges can be sufficiently read even in a short address time. Hence, pixels at a small pitch can be driven. Accordingly, an X-ray flat panel detector for mammography inspection with a pixel pitch of 60 μm can be manufactured. In the prior art, since mounting at a 60-μm pitch is impossible, an X-ray flat panel detector with such small pixels can hardly be manufactured. In addition, according to the X-ray flat panel detector of this embodiment, the circuit characteristic of the peripheral circuit can be improved, and power consumption can be reduced.

(Modifications)

The present invention is not limited to the above-described embodiments. As a highly sensitive X-ray photosensitive film, not only the above-described Se film but also a polycrystalline or single-crystal efficient X-ray photosensitive material such as PbTe, HgTe, or ZnS, or a mixed crystal thereof can be used. The highly sensitive X-ray photosensitive film only needs to have a thickness capable of sufficiently absorbing X-rays. In addition, the thickness of a high-resistive semiconductor film is selected such that optical carriers (electrons or holes) can run through the high-resistive film in a time about 1/10 the address time.

The substrate is not limited to the glass substrate, and any other substrate can be used as long as a TFT can be formed on it. Since the X-ray photosensitive film used in the embodiments can be coated at a low temperature, a plastic substrate with a low heat resistance may be used as a substrate. In this case, the entire X-ray flat panel detector can have plasticity. For the TFT structure, the gates may be formed either on the upper side or on the lower side.

As the protective film, inorganic $SiN_X$ or $SiO_2$, organic polyimides ($\epsilon$=about 3.3; breakdown voltage=300 V/mm), benzocyclobutene ($\epsilon$=about 2.7; breakdown voltage=400 V/mm), an acrylic photosensitive resin HRC available from JSR KK ($\epsilon$=about 3.2), a black resist, or the like is used. These materials may be stacked as needed. As the protective film, a fluorine-based resin is also effective because of its low relative permittivity ($\epsilon$=about 2.1). The protective film need not always be photosensitive. However, a photosensitive material is effective because it can easily be patterned.

Various changes and modifications can be made without departing from the spirit and scope of the present invention. For example, in the above embodiments, an X-ray flat panel detector that employs the direct conversion scheme for converting incident X-rays into electron-hole pairs using a photoelectric conversion film has been exemplified. However, the technical idea of the present invention can also be applied to an X-ray flat panel detector that employs the indirect conversion scheme for temporarily converting incident X-rays into light using phosphor and then converting the light into electron-hole pairs using a photoelectric conversion film.

What is claimed is:

1. An X-ray flat panel detector comprising:
   an X-ray photosensitive film which generates signal charges upon being exposed to incident X-rays;
   a plurality of pixel electrodes which are two-dimensionally arrayed in contact with said X-ray photosensitive film;
   a bias voltage application unit which applies a bias voltage to said X-ray photosensitive film so as to make said plurality of pixel electrodes collect holes or electrons, which serve as the signal charges generated by said X-ray photosensitive film and have a higher mobility;
   a plurality of capacitors which are arranged in correspondence with said pixel electrodes and store the charges generated by said X-ray photosensitive film;
   a plurality of switching thin-film transistors which are arranged in correspondence with said pixel electrodes and read the charges stored in said capacitors;
   a plurality of scanning lines which supply a control signal to OPEN/CLOSE-control said plurality of switching thin-film transistors; and
   a plurality of signal lines which are connected to said plurality of switching thin-film transistors to read the charges when said switching thin-film transistors are opened.

2. A detector according to claim 1, wherein each of said plurality of switching thin-film transistors has an LDD structure.

3. A detector according to claim 1, wherein said plurality of switching thin-film transistors use, as carriers, the holes or electrons, which serve as the signal charges generated by said X-ray photosensitive film and have a higher mobility.

4. A detector according to claim 3, wherein
   said X-ray photosensitive film is substantially made of a material having a hole mobility higher than an electron mobility, and
   each of said plurality of switching thin-film transistors comprises a p-channel thin-film transistor made of single-crystal silicon or polysilicon.

5. A detector according to claim 4, wherein
   said X-ray photosensitive film has an nip structure, and comprises
   said pixel electrodes formed on a p side, and
   a common electrode serving as an anode formed on an n side.

6. A detector according to claim 3, wherein
   said X-ray photosensitive film is substantially made of a material having an electron mobility higher than a hole mobility, and
   each of said plurality of switching thin-film transistors comprises a n-channel thin-film transistor made of single-crystal silicon or polysilicon.

7. A detector according to claim 6, wherein
   said X-ray photosensitive film has an pin structure, and comprises
   said pixel electrodes formed on an n side, and
   a common electrode serving as a cathode formed on a p side.

8. A detector according to claim 1, wherein said X-ray photosensitive film is substantially made of an amorphous semiconductor, a polycrystalline semiconductor, a single-crystal semiconductor, and a mixed-crystal semiconductor each of which is substantially made of one material selected from the group consisting of Se, $PbI_2$, PbTe, HgTe, $HgI_2$, ZnS, ZnTe, GaP, AlSb, CdZnTe, CdTe, CdSe, and CdS.

9. An X-ray flat panel detector comprising:
   an X-ray photosensitive film which generates signal charges upon being exposed to incident X-rays;
   a plurality of pixel electrodes which are two-dimensionally arrayed in contact with said X-ray photosensitive film;
   a bias voltage application unit which applies a bias voltage to said X-ray photosensitive film so as to make said plurality of pixel electrodes collect holes or electrons, which serve as the signal charges generated by said X-ray photosensitive film and have a higher mobility;
   a plurality of capacitors which are arranged in correspondence with said pixel electrodes and store the charges generated by said X-ray photosensitive film;
   a plurality of switching thin-film transistors which are arranged in correspondence with said pixel electrodes and read the charges stored in said capacitors by using, as carriers, the holes or electrons, which serve as the signal charges generated by said X-ray photosensitive film and have a higher mobility;
   a plurality of scanning lines which supply a control signal to OPEN/CLOSE-control said plurality of switching thin-film transistors; and
   a plurality of signal lines which are connected to said plurality of switching thin-film transistors to read the charges when said switching thin-film transistors are opened.

10. A detector according to claim 9, wherein each of said plurality of switching thin-film transistors has an LDD structure.

11. A detector according to claim 9, wherein
    said X-ray photosensitive film is substantially made of a material having a hole mobility higher than an electron mobility, and
    each of said plurality of switching thin-film transistors comprises a p-channel thin-film transistor made of single-crystal silicon or polysilicon.

12. A detector according to claim 11, wherein
    said X-ray photosensitive film has an nip structure, and comprises
    said pixel electrodes formed on a p side, and
    a common electrode serving as an anode formed on an n side.

13. A detector according to claim 9, wherein
    said X-ray photosensitive film is substantially made of a material having an electron mobility higher than a hole mobility, and
    each of said plurality of switching thin-film transistors comprises a n-channel thin-film transistor made of single-crystal silicon or polysilicon.

14. A detector according to claim 13, wherein
    said X-ray photosensitive film has an nip structure, and comprises
    said pixel electrodes formed on an n side, and
    a common electrode serving as a cathode formed on a p side.

15. A detector according to claim 9, wherein said X-ray photosensitive film is substantially made of an amorphous semiconductor, a polycrystalline semiconductor, a single-crystal semiconductor, and a mixed-crystal semiconductor each of which is substantially made of one material selected from the group consisting of Se, PbI$_2$, PbTe, HgTe, HgI$_2$, ZnS, ZnTe, GaP, AlSb, CdZnTe, CdTe, CdSe, and CdS.

16. An X-ray flat panel detector comprising:

an X-ray photosensitive film which is substantially made of a material having a hole mobility higher than an electron mobility and generates signal charges upon being exposed to incident X-rays;

a plurality of pixel electrodes which are two-dimensionally arrayed in contact with said X-ray photosensitive film;

a bias voltage application unit which applies a bias voltage to said X-ray photosensitive film so as to make said plurality of pixel electrodes collect holes;

a plurality of capacitors which are arranged in correspondence with said pixel electrodes and store the charges generated by said X-ray photosensitive film;

a plurality of p-channel thin-film transistors which are arranged on an insulating substrate in correspondence with said pixel electrodes, have a polysilicon film formed into an island shape on the insulating substrate, and read the signal charges stored in said capacitors;

a plurality of scanning lines which supply a control signal to OPEN/CLOSE-control said plurality of p-channel thin-film transistors; and a plurality of signal lines which are connected to said plurality of p-channel thin-film transistors to read the signal charges when said p-channel thin-film transistors are opened.

17. A detector according to claim 16, wherein each of said plurality of p-channel thin-film transistors has an LDD structure.

18. A detector according to claim 16, wherein said X-ray photosensitive film is substantially made of an amorphous semiconductor, a polycrystalline semiconductor, a single-crystal semiconductor, and a mixed-crystal semiconductor each of which is substantially made of one material selected from the group consisting of Se, AlSb, and GaP.

19. A detector according to claim 16, further comprising a plurality of driving circuits which are formed on the island-shaped polysilicon film formed in a peripheral region of an image sensing region where said X-ray photosensitive film, said p-channel thin-film transistors, and said storage capacitor portions are arranged, and drive said plurality of p-channel thin-film transistors.

20. A detector according to claim 19, wherein said X-ray photosensitive film has an pin structure, and comprises said pixel electrodes formed on an side, and a common electrode serving as an anode formed on an p side.

21. An X-ray flat panel detector comprising:

an X-ray photosensitive film which is substantially made of a material having a higher electron mobility than a hole mobility and generates electrons and holes upon being exposed to incident X-rays;

a plurality of pixel electrodes which are two-dimensionally arrayed in contact with said X-ray photosensitive film;

a plurality of capacitors which are arranged in correspondence with said pixel electrodes and store the electrons generated by said X-ray photosensitive film;

a plurality of n-channel thin-film transistors which are arranged in correspondence with said pixel electrodes and read the electrons stored in said capacitors;

a plurality of scanning lines which supply a control signal to OPEN/CLOSE-control said plurality of n-channel thin-film transistors; and a plurality of signal lines which are connected to said plurality of n-channel thin-film transistors to read the electrons when said n-channel thin-film transistors are opened.

22. A detector according to claim 21, wherein each of said plurality of n-channel thin-film transistors has an LDD structure.

23. A detector according to claim 21, wherein said X-ray photosensitive film is substantially made of an amorphous semiconductor, a polycrystalline semiconductor, a single-crystal semiconductor, and a mixed-crystal semiconductor each of which is substantially made of one material selected from the group consisting of PbI$_2$, CdSe, ZnS, ZnTe, CdZnTe, and HgI$_2$.

24. An X-ray flat panel detector comprising:

an X-ray photosensitive film which generates signal charges upon being exposed to incident X-rays;

a plurality of pixel electrodes which are two-dimensionally arrayed in contact with said X-ray photosensitive film;

a bias voltage application unit which applies a bias voltage to said X-ray photosensitive film;

a plurality of capacitors which are arranged in correspondence with said pixel electrodes and store the charges generated by said X-ray photosensitive film;

a plurality of switching thin-film transistors which comprises a p-channel thin-film transistor made of polysilicon and are arranged in correspondence with said pixel electrodes and read the charges stored in said capacitors;

a plurality of scanning lines which supply a control signal to OPEN/CLOSE-control said plurality of switching thin-film transistors; and a plurality of signal lines which are connected to said plurality of switching thin-film transistors to read the charges when said switching thin-film transistors are opened.

25. A detector according to claim 24, wherein each of said plurality of switching thin-film transistors has an LDD structure.

26. A detector according to claim 24, wherein said X-ray photosensitive film is substantially made of an amorphous semiconductor, a polycrystalline semiconductor, a single-crystal semiconductor, and a mixed-crystal semiconductor each of which is substantially made of one material selected from the group consisting of PbI$_2$, CdSe, ZnS, ZnTe, CdZnTe, and HgI$_2$.

27. A detector according to claim 24, wherein said plurality of switching thin-film transistors use, as carriers, the holes which serve as the signal charges generated by said X-ray photosensitive film and have a higher mobility.

28. A detector according to claim 24, wherein said X-ray photosensitive film has one material selected from the group consisting of Se, AlSb, and GaP.

29. A detector according to claim 24, wherein said plurality of switching thin-film transistors use, as carriers, the holes which serve as the signal charges generated by the X-ray photosensitive film.

* * * * *